(12) United States Patent
Nakajima et al.

(10) Patent No.: US 6,312,328 B1
(45) Date of Patent: *Nov. 6, 2001

(54) SYSTEM AND METHOD FOR PRODUCING AND SUPPLYING HIGHLY CLEAN DRY AIR

(75) Inventors: Daiji Nakajima; Yoshio Ishihara, both of Tokyo; Tadahiro Ohmi, Miyagi, all of (JP)

(73) Assignee: Nippon Sanso Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/508,056
(22) PCT Filed: Jul. 8, 1999
(86) PCT No.: PCT/JP99/03681
§ 371 Date: Mar. 7, 2000
§ 102(e) Date: Mar. 7, 2000
(87) PCT Pub. No.: WO00/03423
PCT Pub. Date: Jan. 20, 2000

(30) Foreign Application Priority Data

Jul. 8, 1998 (JP) .................................................. 10-192515

(51) Int. Cl.[7] .................................................. B65G 49/07
(52) U.S. Cl. .......................................... 454/187; 414/940
(58) Field of Search ........................... 454/187; 414/235, 414/940

(56) References Cited

U.S. PATENT DOCUMENTS 4,676,144 * 6/1987 Smith, III ..................... 454/187 X
5,928,077 * 7/1999 Kisakibaru ....................... 454/187
6,095,918 * 8/2000 Arroyo et al. ..................... 454/188

FOREIGN PATENT DOCUMENTS

| 5-211225 | 8/1993 | (JP) . |
|---|---|---|
| 8-191093 | 7/1996 | (JP) . |
| 9-42727 | 2/1997 | (JP) . |
| 9-168722 | 6/1997 | (JP) . |
| 9-205046 | 8/1997 | (JP) . |
| 9-205047 | 8/1997 | (JP) . |
| 9-236289 | 9/1997 | (JP) . |
| 9-264575 | 10/1997 | (JP) . |
| 10-163288 | 6/1998 | (JP) . |
| WO97/24760 | 7/1997 | (WO) . |

* cited by examiner

Primary Examiner—Harold Joyce
(74) Attorney, Agent, or Firm—Armstrong, Westerman, Hattori, McLeland & Naughton, LLP

(57) ABSTRACT

A system and a process for producing and supplying clean dry air capable of producing and supplying clean dry air more inexpensively and using a smaller production plant and also recycling effectively the clean dry air. The system is provided with a clean room containing a transportation system having a storage, a conveyor, etc., and an equipment; a supply passage for supplying the clean dry air to the transportation system and/or the equipment; and a recycling passage for recycling a used clean dry air used in the transportation system and/or the equipment and exhausted therefrom to the transportation system and/or the equipment. The supply passage is connected to the transportation system, whereas the recycling passage is connected to the storage such that the clean dry air used in the transportation system and that in the storage are recycled to the storage.

15 Claims, 3 Drawing Sheets

SYSTEM AND METHOD FOR PRODUCING AND SUPPLYING HIGHLY CLEAN DRY AIR

TECHNICAL FIELD

The present invention relates to a system and a process for producing clean dry air, more particularly to a system and a process for producing and supplying clean dry air to be employed for environmental control in various steps including storage, transportation and treatment of boards in the industrial processes including semiconductor integrated circuit manufacturing process, high-density magnetic disc manufacturing process, liquid crystal panel manufacturing process and solar cell panel manufacturing process.

BACKGROUND ART

Products including semiconductor devices, active matrix liquid crystal panels, solar cell panels and magnetic discs are fabricated by building up successively prescribed thin films on the clean surfaces of boards such as of silicone and glass. Manufacture of each product requires extremely high accuracy, and presence of any impurity even in a trace amount adhered or adsorbed on the board surface makes it difficult to give a high-quality product. Meanwhile, the boards can be electrified during transportation or storage or through various treatments to be liable to attract impurities contained in the ambient air and have them deposited thereon.

For example, if a board under manufacture has any moisture adsorbed on the surface thereof as an impurity, the moisture is causative of troubles in the manufacturing process. Further, if the amount of the adsorbed water is great and if the ambient air contains oxygen, a native oxide film is formed on the surface of the board to hinder formation of prescribed thin films thereon. Meanwhile, presence of any moisture on the surface of an insulating film such as of $SiN_x$ in a process for manufacturing thin film transistors (TFT) to be employed in liquid crystal panels prevents formation of an amorphous silicon (a-Si) film with a uniform thickness and accuracy.

In a step of forming a gate oxide film in the process for manufacturing integrated circuits (IC), if any moisture is present on the surface of n-portion or p-portion, an $SiO_x$ film is formed at the interface between $SiO_2$ and Si, preventing the MOS transistor from functioning as a switch. Simultaneously, if any moisture is present on the surface of a capacitor, an $SiO_x$ film is formed at the interface thereof to prevent charging against a capacitor electrode, and the capacitor fails to function as a storage element.

Furthermore, in a wiring step, while a TiN film is formed for preventing spiking to be caused by tungsten silicide before formation of a tungsten (W) film, presence of any moisture on the board surface causes troubles including drop in the adhesion of the TiN film. In addition, if heat treatment and the like is carried out in the presence of impurities other than moisture, e.g., in the presence of CO or $CO_2$, the carbon reacts on the surface of the board (Si) with the silicon to form an SiC film, causing troubles in the performance characteristics of the device.

Various kinds of equipment employed for manufacturing products including semiconductor integrated circuits are generally installed in a particle-free clean room. Since boards used for manufacturing such products must undergo many treatment steps, they are carried from one treatment step to another treatment step by a transportation system. Since this system is also located in the clean room, the boards under transportation are exposed to the air in the clean room (clean room air). The transportation system is provided with a conveyor for transporting boards and a storage for storing the boards temporarily. The storage further contains a carriage for moving the boards inside.

The inside of the clean room is usually maintained at a temperature of 20 to 25° C. and at a relative humidity of 50%, and large amounts of impurity gases are present, although particles are removed. Accordingly, the impurities present in the clean room air are adsorbed on the surface of the boards. For example, moisture is adsorbed at once on the surfaces of boards. It is actually difficult to remove moisture in the clean room completely so as to prevent such moisture adsorption.

Under such circumstances, Japanese Unexamined Patent Publication No. Hei 10-163288 discloses a transportation robot. This robot carries boards in a pocket charged with dry nitrogen or synthesized air from one treatment step to the next treatment step. According to this technique, boards are prevented fully from being brought into contact with the clean room air during transportation from the transportation system to a treating equipment or equipment. Meanwhile, Japanese Unexamined Patent Publication No. Hei 5-211225 discloses a system in which equipments are connected with tunnels purged with an inert gas such as nitrogen gas, and boards are transported in the inert gas tunnels. According to this system, boards can be transported without exposure to the ambient air, and the boards can be transported utilizing the flow of the inert gas. Further, Japanese Unexamined Patent Publication No. Hei 8-191093 discloses a concept as an improvement of the above system, in which the nitrogen gas flowed through the inert gas tunnel is introduced to a cryogenic separation type nitrogen generator for reutilization therein. Further, WO 97-24760A1 discloses a transportation method utilizing a mixed gas of an inert gas and oxygen as security countermeasures.

Here, clean dry air produced according to the conventional method is obtained by pressurizing the ambient air used as a raw material by an air compressor to a predetermined pressure before introduction to a catalytic purification unit and an adsorptive purification unit. Accordingly, the unit cost of producing the clean dry air is expensive compared with that of the conventional clean room air. On the other hand, there is required a huge quantity of clean air for transportation or storage of boards. For example, in the case where 8-inch Si boards are treated 1000 pcs/day in a semiconductor integrated circuit manufacturing plant, the quantity of clean air used therefor amounts of about 2,000,000 $m^3$/h.

Therefore, it is a great economic load to use large amounts of expensive clean dry air. Further, the cost of the plant for producing such amount of clean dry air amounts to several tens of billion yen per plant, so that it is actually difficult to construct such a scale of plant. In order to reduce the scale of the plant, while there is considered reutilization of the used clean dry air, this requires a recycling fan which can circulate a huge amount of used clean dry air and which does not cause pollution of air and a material of the recycling passage which forms no contaminant.

However, use of a recycling fan requires power for driving it, leading elevation in the cost for achieving recycling of air. In addition, the recycling fan is difficult to achieve recycling of air without causing air pollution since it employs oil for lubrication of bearings in many cases.

Further, if pipes made of galvanized steel plates are used as the recycling passage for the used clean dry air, it can happen that oxygen contained in the recycling air reacts with hydrogen diffusing from the inside of the galvanized steel plates to form moisture on the inner surfaces of the pipes. Accordingly, it is necessary to install additionally an impurity removing apparatus in order to remove contaminants occurring from the recycling fan or the piping material of the recycling passage.

Further, in case of any trouble occurred in the clean dry air producing plant, the plant itself is held up, so that a great investment should be made in backup equipment. Meanwhile, in clean dry air-consuming equipments, since large amounts of clean dry air have been introduced thereto with almost no consideration of the concentrations of impurities contained in the clean dry air, ambient control cannot be achieved effectively, and the clean dry air is consumed wastefully.

DISCLOSURE OF THE INVENTION

It is an objective of the present invention to provide a system and a process for producing and supplying clean dry air, which can produce and supply clean dry air to be employed for environmental control in storage, transportation and treatments of boards in the industrial process including semiconductor, integrated circuit manufacturing process, high-density magnetic disc manufacturing process, liquid-crystal panel manufacturing process and solar cell panel manufacturing process, more inexpensively using a smaller production plant and which can also recycle the clean dry air effectively while can also recycle the clean dry air effectively while eliminating static electricity from the boards.

The clean dry air producing and supplying system of the present invention produces clean dry air in a clean dry air producing apparatus provided with an air compressor, a catalytic purification unit, an adsorptive purification unit, etc. and supplies the thus produced clean dry air to a clean room, for example, in a semiconductor, high-density recording medium or liquid crystal manufacturing plant. The system is located in a clean room containing a transportation system having a storage, a conveyor, etc., and an equipment; a supply passage for supplying the clean dry air to the transportation system and/or the equipment; and a recycling passage for recycling the clean dry air used in the transportation system and/or the equipment to the transportation system and/or the equipment.

The supply passage is connected to the transportation system, and the recycling passage is connected to the storage so as to recycle the clean dry air used in the transportation system.

A boosting equipment is interposed between the air compressor and the catalytic purification unit. The boosting equipment contains an expansion turbine for expanding the clean dry air withdrawn from the adsorptive purification unit and a booster for boosting further the pressure of a raw air with the power generated by the expansion turbine. The piping of the recycling passage is made of an aluminum alloy.

The clean dry air producing and supplying system is also provided with a used clean dry air recycling apparatus clean dry air, being located on the supply passage; and a recycling fan located on the recycling passage, the fan being driven by the power generated by the expansion turbine. The expansion turbine and the recycling fan are connected coaxially. The supply passage and/or the recycling passage is provided with a soft X-ray irradiation electrostatic eliminator.

The clean dry air producing apparatus is installed for a plurality of transportation systems and a plurality of equipments. Meanwhile, two or more clean dry air producing apparatuses can be installed per clean room. In the case where the clean dry air producing and supplying system contains a plurality of clean dry air producing apparatuses, passages for bleeding clean dry air from the clean dry air producing apparatuses respectively can be connected to the supply passage.

The transportation system is provided with an airlock chamber and a board introducing chamber. The board introducing chamber has a passage for introducing the used clean dry air and a passage for exhausting the clean dry air used in the chamber. The equipment is covered entirely with a partition which is provided with a passage for supplying the clean dry air into it.

The clean dry air producing and supplying process according to the present invention is to supply a clean dry air produced through a raw air compressing step, a catalytic purification step, an adsorptive purification step, etc. to a clean room, for example, in a semiconductor, high-density recording medium, liquid crystal manufacturing plant and the like. The clean dry air is supplied to a transportation system and/or an equipment both located in the clean room, the transportation system having a storage, a conveyor, etc., and also the clean dry air used in the transportation system and/or the equipment is recycled to the transportation system and/or the equipment.

Further, the raw air subjected to the raw air compression step is boosted to a pressure higher than the pressure of the air to be supplied to the transportation system or the equipment utilizing the power generated by expanding the clean dry air withdrawn from the adsorptive purification step, and then the resulting raw air is introduced into the catalytic purification step. The used clean dry air is recycled utilizing the power be generated by expanding the clean dry air to be supplied to the transportation system or the equipment.

According to the present invention, the used clean dry air can be recycled with no external driving energy, neither requiring an extra cost nor causing contamination of the clean dry air. Besides, since static electricity can be eliminated from boards efficiently by irradiation of a soft X-ray even when they are maintained in a dry atmosphere, electrostatic breakdown of boards can be prevented.

It is also possible to make effective environmental control for boards by utilizing the used clean dry air having an increased moisture concentration for recycling. Thus, the amount of the used clean dry air to be recycled can be increased, contributing to downsizing of the clean dry air producing apparatus.

Further, the start-up time of the equipment can be reduced by utilizing a part of the used clean dry air for the maintenance treatment of the equipment, and the baking treatment required before the equipment is started becomes unnecessary.

In addition, since the raw air can be boosted by the boosting equipment disposed in the clean dry air producing apparatus, the clean dry air producing apparatus can be downsized, leading to reduction in the initial cost and the footprint. Further, since the consumption of energy in the air compressor becomes small, the clean dry air can be supplied more inexpensively. Meanwhile, if one of the clean dry air producing apparatuses comes to have reduced producing ability or stops, this constitution can prevent drop in the rate of operation in the equipment using the clean dry air or the equipment.

Figure 1:
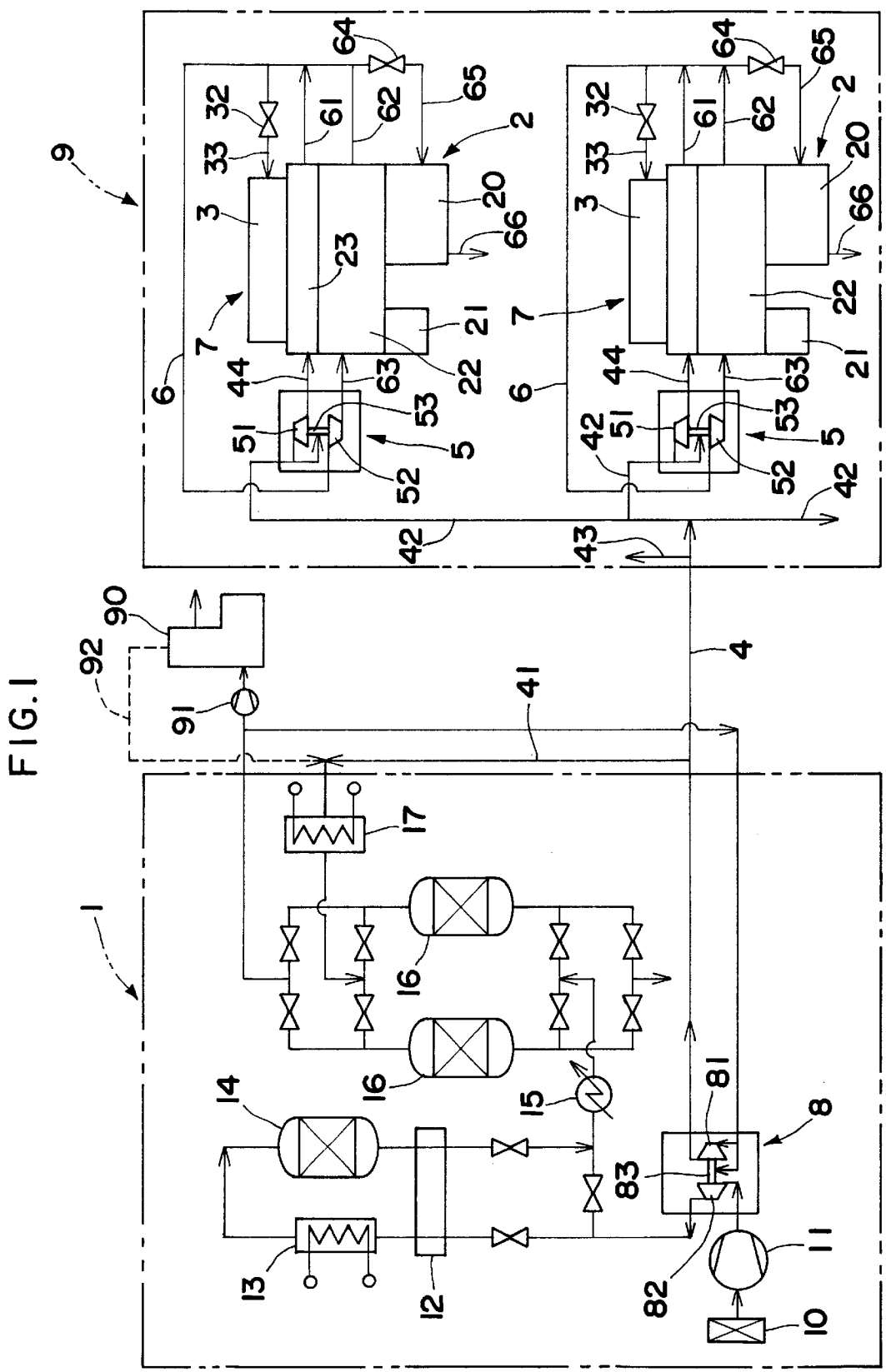
FIG. 1 is a system diagram showing the clean dry air producing and supplying system according to one embodiment of the present invention.

Best Mode for Carrying out the Invention

The clean dry air producing and supplying system according to one embodiment of the present invention will be described referring to FIGS. 1 and 2.

This clean dry air producing and supplying system contains a clean dry air producing apparatus 1; a transportation system 2 and an equipment 3 located in a clean room 9; a supply passage 4 for supplying clean dry air-produced in the clean dry air producing apparatus 1 to the transportation system 2; a used clean dry air recycling apparatus 5 for recycling the clean dry air used in the transportation system 2 and exhausted therefrom to the transportation system 2; and a recycling passage 6 containing the recycling apparatus 5.

The clean dry air producing apparatus 1 contains an air filter 10 for removing dust contained in raw air, an air compressor 11 for compressing the raw air to a predetermined pressure, a heat exchanger 12 for recovering heat, a heater 13 for heating the raw air to a catalytic reaction temperature, a catalytic purification unit 14 for converting hydrogen, carbon monoxide and hydrocarbons contained in the raw air to water and carbon dioxide by catalytic reactions, a pre-cooling unit 15 for cooling the raw air to an adsorptive purification temperature, an adsorptive purification unit 16 for adsorbing and removing carbon dioxide and water contained in the raw air using an adsorbent and a regeneration heater 17 for heating a gas for regenerating the adsorbent packed in the adsorptive purification unit 16. Here, the catalytic purification unit 14 and the adsorptive purification unit 16 may be integrated into a single container packed both with a catalyst and an adsorbent.

While the embodiment shown in FIG. 1 is of the case where two units 7 each containing the transportation system 2, the equipment 3 and the used clean dry air recycling apparatus 5 are installed for one clean dry air producing and supplying apparatus 1, the number of the unit 7 is decided depending on the flow rate of clean dry air to be supplied, and more than two units 7 may be installed.

Further, in the embodiment of FIG. 1, the pressure of the raw air is adapted to be boosted by a boosting equipment 8 utilizing the power to be generated by expanding the clean dry air so as to reduce the load to be applied to the air compressor 11.

It should be noted here that the embodiment of FIG. 1 is of the constitution where the clean dry air produced in the clean dry air producing apparatus 1 is supplied partly to a cryogenic separation type nitrogen generator 90 so as to produce nitrogen employed frequently in the semiconductor producing process. While a compressor 91 is disposed on the upstream side of the cryogenic separation type nitrogen generator 90, it may be omitted if the outlet pressure of the adsorptive purification unit 16 is sufficiently high. Further, the cryogenic separation type nitrogen generator may be installed as necessary and can be omitted.

Next, the flow of the clean dry air produced in the clean dry air producing apparatus 1 and supplied to the unit 7 and also the flow of the used clean dry air to be recycled to the unit 7 will be described more specifically.

The raw air from which dust is removed by the air filter 10 is pressurized by the air compressor 11 to a predetermined pressure, for example, to 0.30 MPa and then introduced to the boosting equipment 8. As the compressor 11, a turbo compressor or a screw compressor can be employed suitably so long as it has a flow rate of 1500 to 20000 Nm$^3$/h (Nm$^3$ means the volume in the standard state (0° C., 1 atm)).

The boosting equipment 8 boosts the pressure of the raw air utilizing the pressure of the clean dry air raw air utilizing the pressure of the clean dry air supplied from the adsorptive purification unit 16, and may be of a coaxial structure having an expansion turbine 81 for expanding the clean dry air and a booster 82 for boosting the pressure of the raw air connected to each other by a common shaft 83. Further, in this embodiment, while a part of the clean dry air is utilized for lubrication of the shaft 83, the lubrication method may be of dynamic pressure or of static pressure. Incidentally, there occurs no leakage of the raw air from the mechanism into the clean dry air in any of these lubrication methods. In the boosting equipment 8, pressure of the raw air is boosted, for example, to 0.46 MPa.

The raw air boosted in the boosting equipment 8 is preheated in the heat exchanger 12, heated by the heater 13 and then introduced to the catalytic purification unit 14. The temperature to which the raw air is to be heated by the heater 13 varies depending on the impurity contents to be removed in the catalytic purification unit 14. For example, in the case where hydrogen, carbon monoxide or a hydrocarbon is to be reacted, the raw air is heated to a temperature ranging from the ambient temperature to about 190° C.; and in the case where methane is to be reacted, the raw air is heated to about 350° C. The catalyst to be employed in the catalytic purification unit 14 includes preferably a noble metal such as Ni, Pt and Pd, a heavy metal such as Fe and Cr or an alloy thereof.

The water and carbon dioxide formed in the catalytic purification unit 14 are introduced together with the raw air to the adsorptive purification unit 16 through the heat exchanger 12 and the pre-cooling unit 15. Here, the raw air is cooled in the heat exchanger 12 and is further cooled to 5° C. to ambient temperature in the pre-cooling unit 15. Thus, the moisture in the raw air can be drained off, and the water content to be introduced to the adsorptive purification unit 16 can be educed. Incidentally, the cooling temperature may be decided depending on the capacity of the pre-cooling unit 15, and the means for cooling the raw air is not to be limited so long as the raw air can be cooled to the above temperature range.

The raw air cooled by the pre-cooling unit 15 is introduced into the adsorptive purification unit 16 packed with an adsorbent such as silica gel, alumina and zeolite or a mixture thereof, where the moisture and carbon dioxide are removed from the raw air each to 10 ppb or less, and thus the raw air is converted to clean dry air. When impurity contents are to be removed according to such adsorption method, since desorption of the impurities adsorbed by the adsorbent must be carried out, the adsorptive purification unit 16 is usually composed essentially of two or more vessels and are operated interchangeably. That is, when one vessel is carrying out an operation of adsorbing impurities, the other vessel carries out regeneration of the adsorbent.

For the regeneration, while a part of the heated self-purified air or the clean dry air diverged from the supply passage 4 into a passage 41 is generally employed, it is also possible to use an exhaust gas free from moisture and carbon dioxide from other processes, for example, an exhaust gas withdrawn from a cryogenic separation type nitrogen generator 90 to a passage 92 as indicated by the broken line in FIG. 1. While the regeneration temperature of the adsorbent is usually 100 to 300° C., it is not limited to the above range and can be decided depending on the regeneration period and the quantity of the regeneration gas.

Meanwhile, the piping through which the clean dry air flows from the adsorptive purification unit 16 and through the boosting equipment 8 to the used clean dry air recycling apparatus 5 is preferably of stainless steel pipes having mirror-polished inner surfaces obtained by electrolytic polishing treatment or aluminum alloy pipes having oxide films formed thereon by anodization, electrolytic polishing and pure water-washing treatment.

The clean dry air from which impurity contents were removed in the adsorptive purification unit 16 is introduced to the expansion turbine 81 of the boosting equipment 8 and is expanded there, and after the expanded air is utilized as the power for boosting the raw air, it is diverged from the supply passage 4 into a branch passage 42 to be supplied through the used clean dry air recycling apparatus 5 into the unit 7 and is also diverged into a branch passage 43 to be supplied to the clean room 9.

Here, the inlet pressure of the boosting equipment 8 is, for example, 0.46 MPa, and the outlet pressure of the expansion turbine 81 is, for example, 0.15 MPa. In order to prevent entry of impurities from the ambient air, the external leakage from the expansion turbine 81 should be desirably $1 \times 10^{-9}$ Torr·L/s or less, particularly $1 \times 10^{-11}$ Torr·L/s or less.

Next, the used clean dry air recycling apparatus 5 will be described. This recycling apparatus 5 recycles the used clean dry air to the unit 7 utilizing the pressure of the clean dry air, and, for example, a coaxial type having an expansion turbine 51 for expanding the clean dry air and a recycling fan 52 connected to a common shaft 53 can be employed as the apparatus 5. The dynamic pressure or static pressure lubrication utilizing a part of the clean dry air is utilized for lubrication of the shaft 53. In any of these lubrication methods, there occurs no problem if the clean dry air used for lubrication migrates into the clean dry air supplied from the clean dry air producing apparatus 1 so long as the impurity concentration in the used clean dry air is 100 ppb or less.

Here, in order to prevent migration of impurities from the ambient air, the external leakage from the recycling apparatus 5 should be $1 \times 10^{-9}$ Torr·L/s or less, desirably $1 \times 10^{-11}$ Torr·L/s or less. Incidentally, the expansion turbine 51 and the fan 52 need not be connected coaxially but may be of a structure containing a speed change gear, or the expansion turbine 51 may be provided with a supplemental drive motor. However, in the case where the expansion turbine 51 is provided with the supplemental drive motor, the drive shaft of the motor is desirably purged with the clean dry air or the used clean dry air. The recycling apparatuses 5 may be arranged in series to effect stepwise reduction to a predetermined pressure.

The transportation system 2 which uses the clean dry air contains a board introducing chamber 20, an airlock chamber 21, a storage 22 having a carriage, and a conveyor 23. The equipment 3 is located adjacent to the conveyor 23. Gate valves (not shown) having excellent airtightness are interposed between the storage 22 and the board introducing chamber 20, the airlock chamber 21 and the conveyor 23, and between the conveyor 23 and the equipment 3 respectively, and boards travel through these gate valves among these chambers and equipments.

Materials employable for forming the board introducing chamber 20, the airlock chamber 21, the storage 22, the conveyor 23, the equipment 3 and the recycling passage 6 include suitably aluminum alloys and stainless steel, and the external leakage from them should be $1 \times 10^{-9}$ Torr·L/s or less, desirably $1 \times 10^{-11}$ Torr·L/s or less. Particularly, aluminum alloys are useful for achieving weight reduction, and those having oxide films are preferred.

Figure 2:
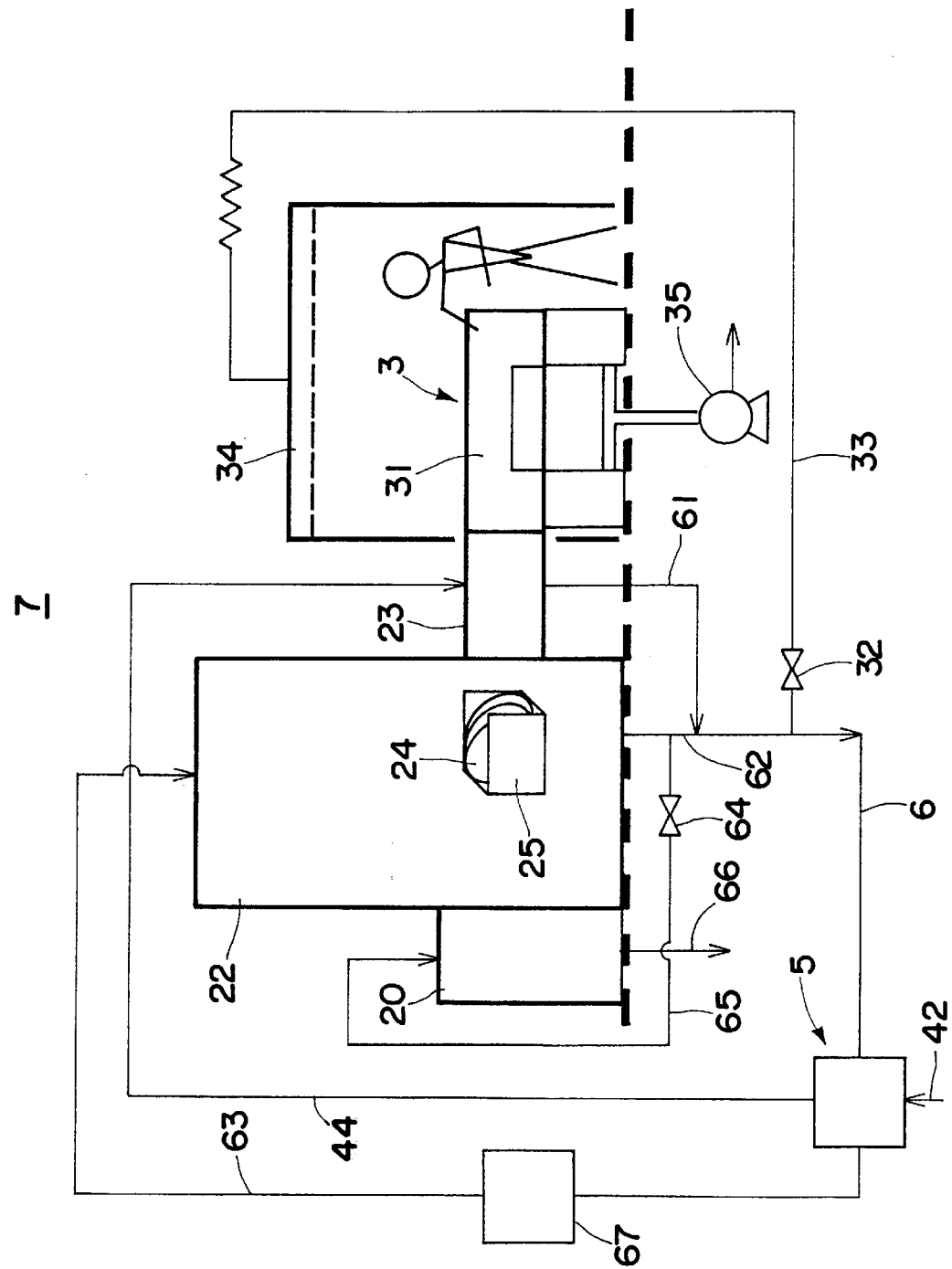
FIG. 2 is an explanatory drawing for explaining the flow of air in the transportation system and the equipment.

As shown in FIG. 2, boards 24 are stored in a board case 25 (25 pcs/case) and are carried as such into the board introducing chamber 20 where the moisture, hydrocarbons, etc. adsorbed on the surface of each board are eliminated using clean dry air, and the resulting boards are carried by the carriage into the storage 22 to be stored therein temporarily. Incidentally, the storage 22 may serve also as the board introducing chamber 20.

The board case 25 in the storage 22 are transferred by the carriage to the conveyor 23, and the conveyor 23 picks up the boards 24 one by one from the board case 25 and carries them into the equipment 3. Each board 24 is subjected to a predetermined treatment in the equipment 3. A plurality of conveyors 23 and a plurality of equipments 3 may be installed per storage 22.

The board 24 subjected to a predetermined treatment is returned from the equipment 3 through the conveyor 23 to the storage 22 and is carried out by the carriage into the airlock chamber 21. Since the airlock chamber 21 is isolated by the storage 22 or the carriage and the gate valve, the clean dry air used in the storage 22 is not exhausted therefrom in a large amount to the outside of the system.

The clean dry air in the transportation system 2 and that in the equipment 3 are recycled as follows. The clean dry air produced in the clean dry air producing apparatus 1 is introduced through the branch passage 42 to the expansion turbine 51 of the used clean dry air recycling apparatus 5 and is depressurized there to a predetermined pressure, for example, to 160 mmAq.

The thus depressurized clean dry air is introduced through a passage 44 to the conveyor 23, where it is used for ambient control of the conveyor 23 and then exhausted to a passage 61. The thus exhausted used clean dry air is combined with the used clean dry air withdrawn from the storage 22 into a passage 62, and the combined air is introduced through the recycling passage 6 into the fan 52 of the recycling apparatus 5.

The used clean dry air boosted by the fan 52 to a predetermined pressure, for example, to 160 mmAq, flows not through the passage for the clean dry air but through another passage 63 and is introduced, for example, to the storage 22 where it is used for ambient control. The greatest part of the used clean dry air is fed from the passage 62, again through the recycling system, to the recycling apparatus 5. The used clean dry air in the passage 62 is partly fed through a valve 64 and a passage 65 into the board introducing chamber 20, where it is used for purging of another board 24 carried into it, and then exhausted from a passage 66 to the outside of the system. Recycling of the used clean dry air is not particularly limited to this embodiment but can be carried out by supplying the used clean dry air to the transportation equipment 2 and/or the equipment 3 and by recycling the used clean dry air exhausted from the transportation equipment 2 and/or the equipment 3 to the transportation equipment 2 and/or the equipment 3.

Further, the supply passage 4 and the recycling passage 6 are provided with soft X-ray irradiation electrostatic eliminators 67 at suitable positions respectively. To describe briefly the principle of this soft X-ray irradiation electrostatic eliminator, electromagnetic waves in the X-ray region can be obtained by irradiating an electron beam having a predetermined energy upon a specific substance (e.g., tungsten). While the wavelength of the X-ray to be generated depends on the target upon which the electron beam is irradiated, a soft X-ray in the wavelength range of 0.1 to 10 nm is preferably used. It is further preferred to use, as the electromagnetic waves in the X-ray region, those generated by impingement of electron beams accelerated to 4 kV or more against a target with a target voltage (acceleration voltage) of 4 kV or higher. It is further preferred to use electromagnetic waves generated under a target current of 60 $\mu$A or more.

Gas molecules and atoms adsorbs electromagnetic waves in the X-ray region to be ionized directly. Since the ionization energy of the gas molecules and that of atoms are at most about 20 eV, this is one several hundredths of the photon energy in the X-ray region. Accordingly, one photon can achieve ionization of a plurality of atoms and molecules or formation of ions having a valence of 2 or more, and it can also form a large amount of ion pairs. Thus, the period for static elimination can be reduced to several seconds or less. Further, by adjusting the concentration of ion pairs to be formed within $10^5$ to $10^6$ ion pairs/cm$^3$, the ion life can be extended to 10–1000 sec. Since the ion life is relatively long as described above, static electricity can fully be neutralized by locating the soft X-ray irradiation electrostatic eliminator 67 on the upstream side of boards statically electrified, i.e., on the passage 63.

Further, in the case where the soft X-ray irradiation electrostatic eliminator 67 is attached to the recycling passage 6, it is not preferred to insert the target metal into the passage, so that a soft X-ray is irradiated through a polyimide window, and thus the system is free from absorption of soft X-ray and from contamination of clean dry air.

Here, the sites where the soft X-ray irradiation electrostatic eliminators 67 are to be installed may be decided depending on the ion life, the length of the recycling passage 6, flow rate of the used clean dry air, etc., and they may be located on the upstream side or downstream side of the recycling apparatus 5.

In the case where a reactor 31 in the equipment 3 is to be opened for the maintenance thereof, the used clean dry air is introduced through a passage 33 having a valve 32 into a partition 34 covering the equipment 3 and is exhausted with a pump 35. Thus, impurity contents including moisture to be adsorbed in the reactor when maintenance of the reactor 31 is to be carried out can be reduced to shorten the start-up time of the equipment 3. Incidentally, the passage 33 may be connected to any part of the recycling system, and may be connected to the passage 42 or 44 for supplying the clean dry air. In addition, the number of the passage 33 can be decided as necessary.

Further, in this embodiment, while the clean dry air subjected to expansion in the boosting equipment 8 to have a reduced pressure is supplied from the clean dry air producing apparatus 1 to the recycling apparatus 5, the high-pressure clean dry air withdrawn from the adsorptive purification unit 16 without going through the boosting equipment 8 can be introduced directly to the apparatus 5.

Figure 3:
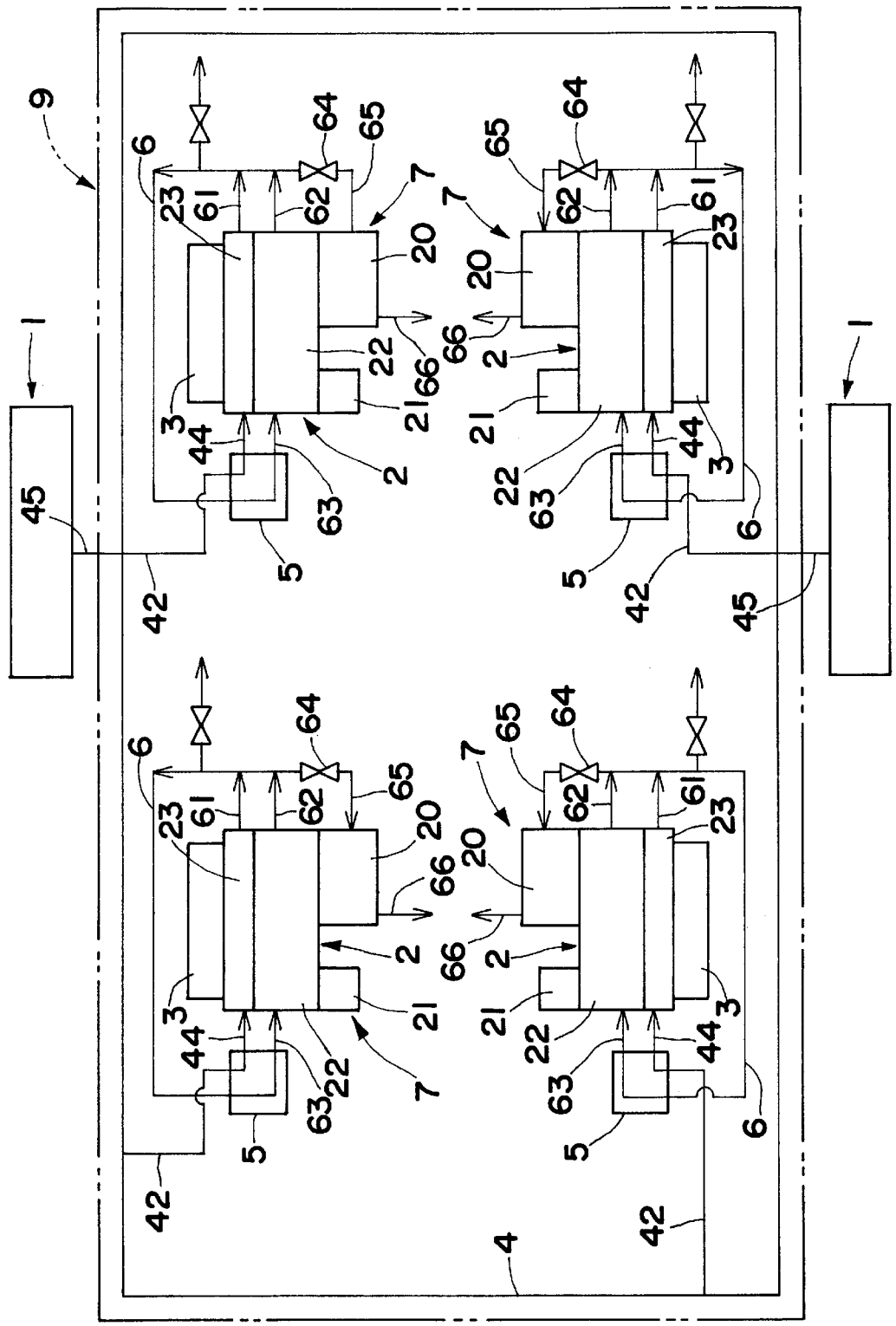
FIG. 3 is a schematic system diagram showing an embodiment where two clean dry air producing and supplying apparatuses are installed.

Next, FIG. 3 is a schematic system diagram showing an embodiment where a plurality of clean dry air producing apparatuses 1 are installed. It should be noted here that the same or like constituents as in the foregoing embodiment are affixed with the same reference numbers respectively, and detailed description of them will be omitted.

In this embodiment, two clean dry air producing apparatuses 1 are connected to four units 7 located in a clean room 9 via a supply passage 4. That is, passages 45 for bleeding the clean dry air from the clean dry air producing apparatuses 1 respectively are connected to the loop supply passage 4, and four branch passages 42 branching out from the supply passage 4 are connected to recycling apparatuses 5 of the units 7 respectively.

Since a plurality of clean dry air producing apparatuses 1 are connected with a plurality of recycling apparatuses 5 via the supply passage 4 as described above, for example, if one of the clean dry air producing apparatuses 1 comes to have reduced producing ability or stops, it can be backed up readily by the other apparatuses 1, causing no significant drop in the rate of operation in the equipment using the clean dry air. Incidentally, while the embodiment shown in FIG. 3 is of the case where two clean dry air producing apparatuses are installed, the number of the apparatus 1 is not to be limited so long as it is plural. Meanwhile, a loop supply system is exemplified, the supply system may be linear. Further, the above constitution can be applied analogously to the case where there are a plurality of clean rooms.

EXAMPLE

Clean dry air was produced using the system of the embodiment shown in FIG. 1 to confirm its impurity concentration, equipment cost and unit cost. The clean dry air was produced at a rate of 4000 Nm$^3$/h. The boosting pressure in the compressor was 0.30 MPa. The pressure of the air was boosted by the booster 82 of the boosting equipment 8 to 0.46 MPa, and the air was passed through the catalytic purification unit 14 and the adsorptive purification unit 16 and then introduced to the expansion turbine 81 of the boosting equipment 8 to effect depressurization to 0.15 MPa. Concentrations of moisture, carbon monoxide, carbon dioxide and hydrogen contained in the clean dry air produced were determined respectively, and the results are shown below. Here, the results of determination are shown in terms of mean values when each impurity was measured every 15 minutes over 70000 minutes respectively.

| Impurity | Concentration [ppb] |
| --- | --- |
| Moisture | 2.6 |
| Carbon monoxide | 5.1 |
| Carbon dioxide | 2.9 |
| Hydrogen | 1.3 |

Further, comparison was made between the case where the boosting equipment 8 was employed and the case where it was not employed in terms of equipment cost and footprint to obtain ratios provided that the equipment cost and the footprint of the latter case using no boosting equipment 8 are each 1. The results are as follows.

| Boosting equipment | Equipment cost | Footprint |
| --- | --- | --- |
| Present | 0.65 | 0.50 |
| Absent | 1 | 1 |

Further, production costs were calculated from the energy required for producing 1 Nm$^3$ of clean dry air in these two cases and were compared. It should be noted here that the depreciation expense of the clean dry air producing apparatus itself was excluded in each case. As a result, the production cost in the presence of the boosting equipment 8 dropped to about 50% of that in the absence of the equipment 8.

Next, effect of the used clean dry air recycling apparatus 5 was confirmed. The quantity of the gas to be recycled when the 120 mmAq used clean dry air was boosted to 160 mmAq for recycling was measured in a coaxial recycling apparatus 5 having an expansion turbine 51 capable of supplying clean dry air at a rate of 1800 Nm³/h and under a pressure of 0.15 MPa and a recycling fan 52. The result the measurement showed that the quantity of the recycling gas was 2000 Nm³/h. That is, it was found that the apparatus 5 can recycle 2000 Nm³/h of the used clean dry air using no extra energy. Meanwhile, operation of the recycling apparatus 5 incorporated with a speed change gear gave a recycling gas quantity of about 86500 Nm³/h under the above conditions.

Further, the concentration of moisture contained in the clean dry air was measured at each section of the transportation system 2. In order to test first the overall performance of the transportation system 2, clean dry air was introduced to the recycling apparatus 5 at a rate of 1800 Nm³/h, and the moisture concentration was measured in the absence of boards. Next, the moisture concentration was measured in the presence of boards. As the boards 24, 8-inch Si boards were used. The Si boards were fed to the board introducing chamber 20 lot by lot (25 pcs/lot) every 15 minutes, stored in the storage 22 for one hour and then carried out through the airlock chamber 21. Incidentally, the conveyor 23 carried 100 pcs. of boards per hour.

The moisture concentration in the clean dry air supplied from the clean dry air producing apparatus 1 into the branch passage 42 was 3 ppb. The moisture concentration in the passage 44 and that in the passage 61 were 3 ppb and 3.5 ppb respectively. Meanwhile, the moisture concentration at the inlet of the recycling apparatus in the recycling passage 6 was increased to 200 ppb, and the moisture concentration in the passage 62 was also 200 ppb.

It is considered that these results were brought about by the piping made of galvanized steel plates or a synthetic resin used as the recycling passage 6. Therefore, aluminum alloy piping was used as the recycling passage 6 to measure the moisture concentration again, and the moisture concentration in the passage 43 and that in the passage 61 were found to be 3 ppb and 3.5 ppb respectively, which were the same values as those before replacement of the pipes. Both the moisture concentration at the inlet of the recycling apparatus in the recycling passage 6 and that in the passage 62 were 4 ppb. The gas to be released and diffused from the inner wall of the piping can be reduced by changing the material of the recycling passage 6 to an aluminum alloy, and the clean dry air can be recycled without contamination of it.

Next, the moisture concentration was measured at each section of the transportation system 2 in the presence of boards. As a result, the moisture concentrations in the passages 42, 43 and 61 were the same as described above respectively. The moisture concentration at the inlet of the recycling apparatus 5 in the recycling passage 6 was 48 ppb, and those in the passage 62 and 66 were 53 ppb and 400 ppb respectively. It was thus found that the moisture concentration were higher in the following order: transportation system (for which the equipment 3 demands the highest cleanliness)<storage 22<board introducing chamber 20.

Another test showed that the amount of moisture adsorbed by the board surfaces to migrate into the board introducing chamber 20 is about 0.01 mol/h, and the amount of moisture adsorbed in equilibrium on an Si surface subjected to hydrogen-termination treatment, an $SiO_2$ surface and an Si surface subjected to fluorine-termination treatment were $1\times10^{13}$ molecules/cm², $2.6\times10^{14}$ molecules/cm² and $3.6\times10^{14}$ molecules/cm², respectively, when the moisture concentration in the gas phase is 100 ppb. The reason why the moisture concentration at the outlet of the board introducing chamber 20 is high is, because the moisture is desorbed from the board. Accordingly, utilization of the used clean dry air having a moisture concentration increased to some extent by recycling it enables effective control of the ambient for the boards.

Further, a soft X-ray irradiation electrostatic eliminator 67 employing a polyimide window was incorporated into the passage 63 so as to confirm the effect of removing static electricity from the boards. Specifications of the soft X-ray irradiation electrostatic eliminator 67 used in this test are as follows. The electrostatic eliminator 67 has a cylindrical shape with a diameter of 10 cm and a length of about 30 cm; and the diameter of the piping in the passage 63 is about 60 cm. Therefore, an opening was defined at some part of the piping, and a polyimide window having a diameter of 10 cm was applied to the opening. Then, the inside of the passage was irradiated with a soft-ray through this window.

| | |
|---|---|
| Target: | tungsten |
| Target voltage: | 4 kV |
| Target current: | 60 μA |

Boards having a capacitance of 10 pF and an initial potential of ±3 kV were employed in this test. The soft X-ray irradiation electrostatic eliminator 67 was located on the passage 63 at a distance of 5 m upstream from the storage 22, and the average flow velocity of the clean dry air was 5 m. As a result, the potential of the boards decreased gradually after irradiation of the soft X-ray to be as low as or lower than the limit of measurement (±30 V) of an electrometer.

Further, the reactor 31 was opened with the used clean dry air being introduced thereto through the passage 33 from the top of the partition 34 covering the equipment 3 at a flow rate of 180 m³/min, and the start-up time was measured after repair of the reactor for one hour. The pressure in the reactor 31 dropped to $10^{-8}$ Pa in about 100 minutes after initiation of evacuation thereof under introduction of the clean dry air. Meanwhile, when the gaseous components remained in the reactor were measured using a partial pressure vacuum gauge, it was found that the moisture content was about $10^{-9}$ Pa and that the greatest part of the residual gas was nitrogen gas.

On the other hand, when the reactor 31 was repaired under no introduction of clean dry air, the pressure dropped to $10^{-8}$ Pa in about 1000 minutes after initiation of evacuation thereof. It was found that the residual moisture content at this point was $5\times10^{-9}$ Pa and that the greatest part of the residual gas was moisture. As described above, by introducing clean dry air during maintenance treatment of the equipment 3, adsorption of moisture in the reactor can be prevented, and not only the start-up time can be reduced to 1/10 of that in the conventional system but also baking of the equipment 3 becomes unnecessary.

What is claimed is:

1. A system for producing and supplying a clean dry air in a clean dry air producing apparatus equipped essentially with an air compressor, a catalytic purification unit and an adsorptive purification unit, and supplying the clean dry air into a clean room of a semiconductor, high-density recording medium or liquid crystal manufacturing plant; the system comprising:

a transportation system having a storage, a conveyor, and an equipment, which are located in the clean room;

a supply passage for supplying the clean dry air to the transportation system and/or the equipment;

a recycling passage for recycling a used clean dry air in the transportation system and/or the equipment to the transportation system and/or the equipment; and a used clean dry air recycling apparatus having a fan-driving expansion turbine for expanding the clean dry air, being located on the supply passage; and a recycling fan located on the recycling passage, the recycling fan being driven by a power generated by the expansion turbine.

2. The clean dry air producing and supplying system according to claim 1, wherein the supply passage is connected to the transportation system, and the recycling passage is connected to the storage so as to recycle the clean dry air used in the transportation system.

3. The clean dry air producing and supplying system according to claim 1, wherein an aluminum alloy piping is used as the recycling passage.

4. The clean dry air producing and supplying system according to claim 1, wherein the expansion turbine and the recycling fan are connected coaxially.

5. The clean dry air producing and supplying system according to claim 1, wherein the clean dry air producing apparatus is installed for a plurality of transportation systems and a plurality of equipments.

6. The clean dry air producing and supplying system according to claim 1, wherein a plurality of clean dry air producing apparatuses are installed per clean room.

7. The clean dry air producing and supplying system according to claim 1, containing a plurality of clean dry air producing apparatuses, with passages for exhausting clean dry air from the clean dry air producing apparatuses respectively being connected to the supply passage.

8. The clean dry air producing and supplying system according to claim 1, wherein the transportation system is provided with an airlock chamber.

9. The clean dry air producing and supplying system according to claim 1, wherein the transportation system is provided with a board introducing chamber having a passage for introducing the used clean dry air and a passage for exhausting the clean dry air used in the chamber connected thereto.

10. The clean dry air producing and supplying system according to claim 1, wherein the equipment is covered entirely with a partition which is provided with a passage for supplying the clean dry air into it.

11. A clean dry air producing and supplying process for supplying a clean dry air produced through a raw air compressing step, a catalytic purification step, an adsorptive purification step, etc. to a clean room in a semiconductor, high-density recording medium or liquid crystal manufacturing plant; the process comprising: supplying the clean dry air to a transportation system and/or an equipment located in the clean room, the transportation system having a storage, a conveyor, and also recycling the clean dry air used in the transportation system and/or the equipment to the transportation system and/or the equipment.

12. The clean dry air producing and supplying process according to claim 11, wherein the raw air subjected to the raw air compression step is boosted up to a pressure higher than the pressure to be supplied to the transportation system or the equipment utilizing a power to be generated by expanding the clean dry air withdrawn from the adsorptive purification step, followed by introduction of the resulting raw air into the catalytic purification step.

13. The clean dry air producing and supplying process according to claim 11, wherein the used clean dry air is recycled utilizing a power to be generated by expanding the clean dry air to be supplied to the transportation system or the equipment.

14. A system for producing and supplying a clean dry air in a clean dry air producing apparatus equipped essentially with an air compressor, a catalytic purification unit and an adsorptive purification unit, and supplying the clean dry air into a clean room of a semiconductor, high-density recording medium or liquid crystal manufacturing plant; the system comprising:

a transportation system having a storage, a conveyor, and an equipment, which are located in the clean room;

a supply passage for supplying the clean dry air to the transportation system and/or the equipment; and a recycling passage for recycling a used clean dry air in the transportation system and/or the equipment to the transportation system and/or the equipment;

wherein a boosting equipment is interposed between the air compressor and the catalytic purification unit; the boosting equipment containing an expansion turbine for expanding the clean dry air withdrawn from the adsorptive purification unit and a booster for boosting further the pressure of a raw air with a power generated by the expansion turbine.

15. A system for producing and supplying a clean dry air in a clean dry air producing apparatus equipped essentially with an air compressor, a catalytic purification unit and an adsorptive purification unit, and supplying the clean dry air into a clean room, of a semiconductor, high-density recording medium or liquid crystal manufacturing plant; the system comprising:

a transportation system having a storage, a conveyor, and an equipment, which are located in the clean room;

a supply passage for supplying the clean dry air to the transportation system and/or the equipment; and a recycling passage for recycling a used clean dry air in the transportation system and/or the equipment to the transportation system and/or the equipment; wherein the supply passage and/or the recycling passage is provided with a soft X-ray irradiation electrostatic eliminator.

\* \* \* \* \*